United States Patent [19]

Yu

[11] Patent Number: 5,516,304

[45] Date of Patent: May 14, 1996

[54] ENHANCED ELECTRICAL CONNECTOR

[75] Inventor: Wang-I Yu, Taipei Hsien, Taiwan

[73] Assignee: Berg Technology, Inc., Reno, Nev.

[21] Appl. No.: 365,708

[22] Filed: Dec. 29, 1994

Related U.S. Application Data

[62] Division of Ser. No. 121,210, Sep. 14, 1993, Pat. No. 5,413,496.

[51] Int. Cl.⁶ .................................................. H01R 13/62
[52] U.S. Cl. .................................................. 439/326
[58] Field of Search ...................... 439/59–62, 152–160, 439/326–329, 629–637

[56] References Cited

U.S. PATENT DOCUMENTS

| | | | |
|---|---|---|---|
| 4,995,825 | 2/1991 | Korsunsky et al. | 437/328 |
| 5,112,242 | 5/1992 | Choy et al. | 439/328 X |
| 5,154,627 | 10/1992 | Lee | 439/327 X |
| 5,169,333 | 12/1992 | Lee | 439/326 |
| 5,174,780 | 12/1992 | Lee | 439/326 |
| 5,244,403 | 9/1993 | Smith et al. | 439/326 |
| 5,256,078 | 10/1993 | Lwee et al. | 439/326 |
| 5,395,262 | 3/1995 | Lwee | 439/326 |

*Primary Examiner*—Khiem Nguyen
*Attorney, Agent, or Firm*—Woodcock Washburn Kurtz Mackiewicz & Norris

[57] ABSTRACT

An electrical connector comprises a housing having latch members at both ends of the housing and a pair of metal fasteners capable of clamping on the latch members. The housing has a longitudinal groove for receiving a daughter board. The metal fastener includes a fixing section and a spring section which substantially extends uprightly therefrom. The fixing section clamps on the housing. The spring section is provided with a restriction leg and a slot which are formed by punching, and the restriction leg is substantially vertical to the surface of the spring section. When the metal fastener clamps on the housing, a rib provided at the end portion of the latch member fits the slot of the spring section so as to prevent the side shifting of the metal fastener.

5 Claims, 6 Drawing Sheets

ENHANCED ELECTRICAL CONNECTOR

This is a division of application Ser. No. 08/121,210, filed Sep. 14, 1993 now U.S. Pat. No. 5,413,496.

FIELD OF THE INVENTION

The present invention relates to an electrical connector, in particular, to an anti-overstressing electrical connector for connecting together two circuit boards.

BACKGROUND OF THE INVENTION

An electrical connector is a device which electrically and mechanically connects, for example, a memory control board called a "mother board" to a daughter board such as a single-in-line memory module (SIMM). A conventional electrical connector comprises a housing to be mounted on a mother board and one pair of metal latch members. Each latch member may be inserted into a latch receiving member provided near one end of the housing for holding a daughter board. The housing has a slot for receiving a base end of the daughter board. Contact terminals are provided in the slot to enable electrical contacts between the mother and daughter boards.

The daughter board which is inserted into the slot is rotated along an axis of the slot between the paired metal latch members. When the side edges of the daughter board come into contact with the metal latch members, the paired metal latch members can be elastically flexed away from each other. The daughter board reaches a predetermined position, and the paired metal latch members elastically return to their initial positions. Thus, the daughter board is held in a sandwiched relation. However, the fixing type of the metal latch members is by way of "insertion." When attaching and detaching of the daughter board is repeated, the metal latch members may become loose and lose its stability and the clamping force against the daughter board.

Furthermore, the latch receiving members must be complex and large enough to receive the insertion of the metal latch members. More material may be needed due to a larger outer configuration of the housing. It may not be easy to mold a housing of such a complex configuration. As a result, the electrical connector is complex and expensive to manufacture.

SUMMARY OF THE INVENTION

Due to the drawbacks discussed above, one of the objects of this invention is to provide an electrical connector that is simpler and easier to manufacture at a low cost. It is another object to ensure high durability of paired metal fasteners and enhances the reliability with which the daughter board can be electrically connected to contact terminals even after repeated attachment and detachment of a daughter board to and from a housing.

The electrical connector in accordance with the present invention for connecting a first circuit board and a second circuit board comprises:

an one-piece elongated housing which is molded of an insulating resin material to be attached to a first circuit board and has a longitudinal groove to receive a second circuit board, and a pair of latch members each extending from near each end of the housing. The electrical connector also comprises a plurality of contact terminals provided in the groove of the housing for connecting together the first and second circuit boards; and a pair of metal fasteners each including a fixing section and a spring section extending uprightly therefrom. Each metal fastener clamps on the housing adjacent to one of the latch members and elastically holds the side edge of the second circuit board with the fixing section which clamps on the end portion of the housing and the spring section which is placed in elastic contact with the resin latch member.

According to one aspect of the present invention, the second circuit board has a pair of openings each located near the end thereof, and the latch member of the housing has a corresponding boss for engaging the opening in the second circuit board.

Preferably, the spring section of the metal fastener is flexible to resist the stress caused by attaching the second circuit board. A restricting leg and a slot are formed by punching the spring section. The restricting leg is substantially vertical to the surface of the spring section and has a suitable clearance with the fixing section. Further, a rib provided at the end portion of the latch member corresponds to the slot of the spring section. When the metal fastener clamps on the housing, the rib fits snugly within the slot to prevent the side shifting of the metal fastener.

Preferably, the fixing section is provided with two pairs of mounting legs at the side plates thereof, wherein each pair of mounting legs locate at the lower corners of the side plate and is separated by a space. The mounting legs can clamp the end portion of the housing firmly to ensure the stability of the metal fastener.

According to another embodiment of the present invention, the fixing section has two openings each at the side plates thereof. The corresponding sides of the end portion of the housing are provided with a projection. The openings of the metal fastener engage the projections of the housing to ensure the stability of the metal fastener.

These and other objects, advantages and features of the present invention will be more fully understood and appreciated by reference to the written specification.

DETAILED DESCRIPTION OF THE INVENTION

Figure 1:
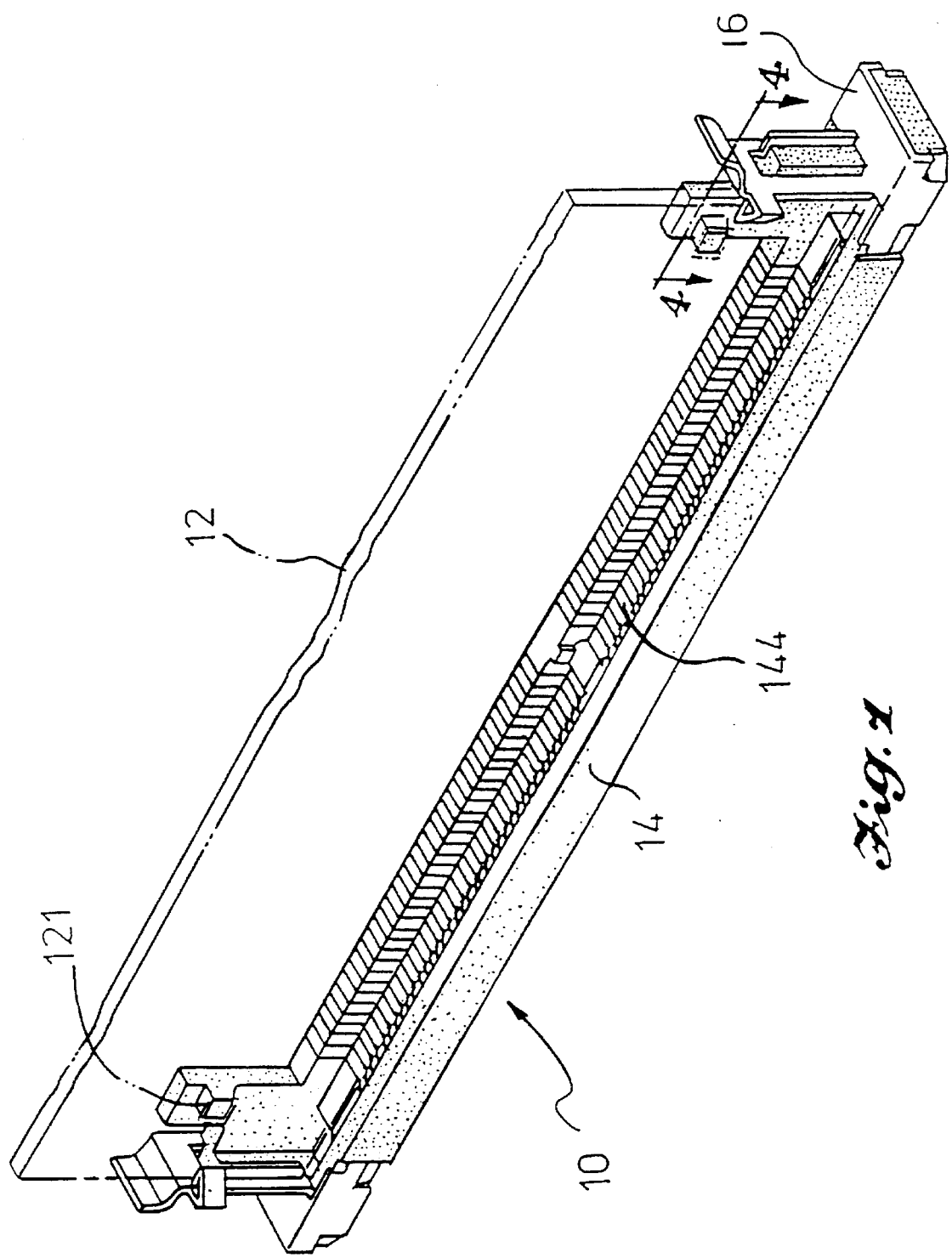
FIG. 1 is a perspective view of a first embodiment.
Figure 2:
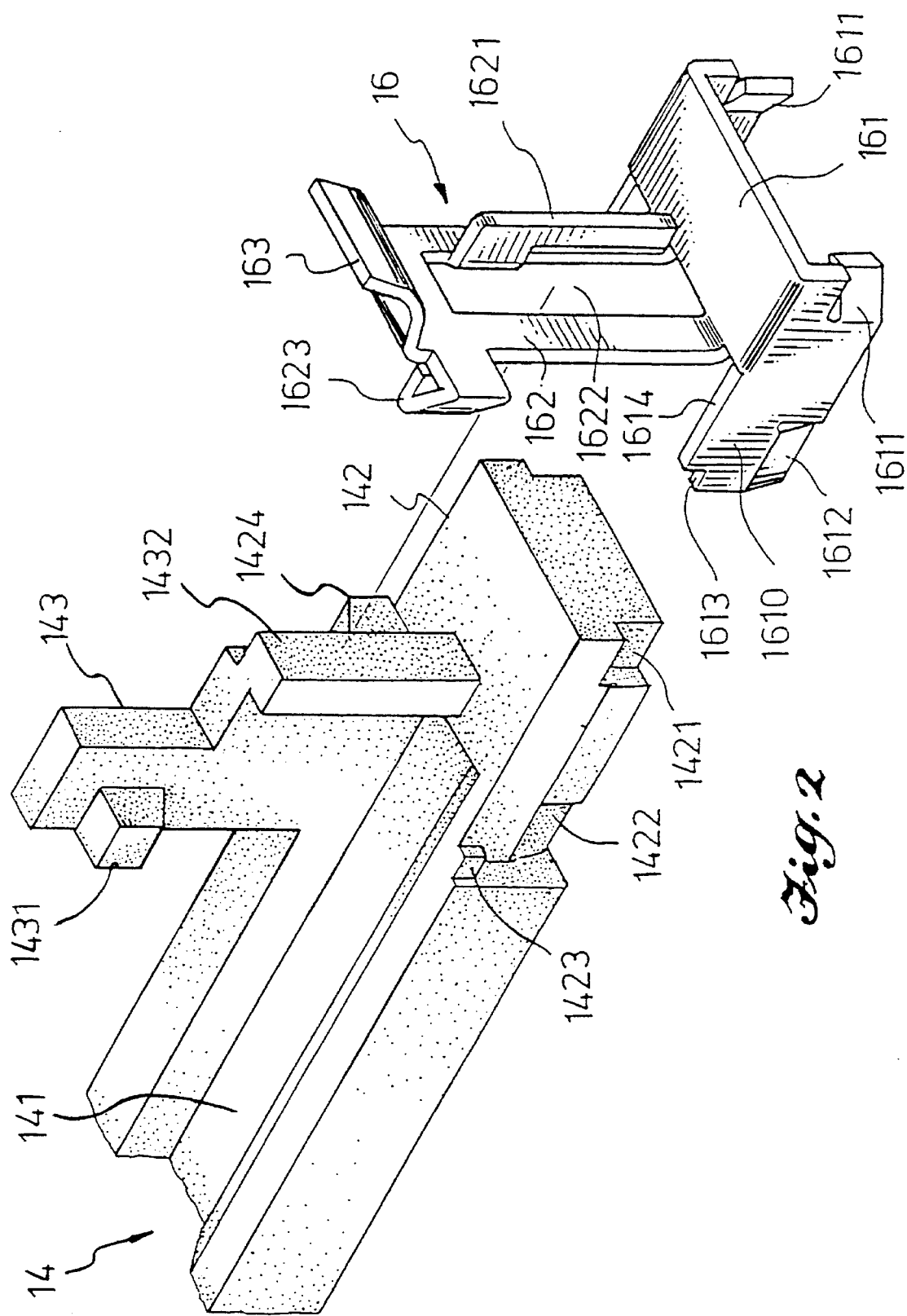
FIG. 2 is a partially enlarged fragmentary view of the first embodiment, wherein contact terminals are omitted for simplification.
Figure 3:
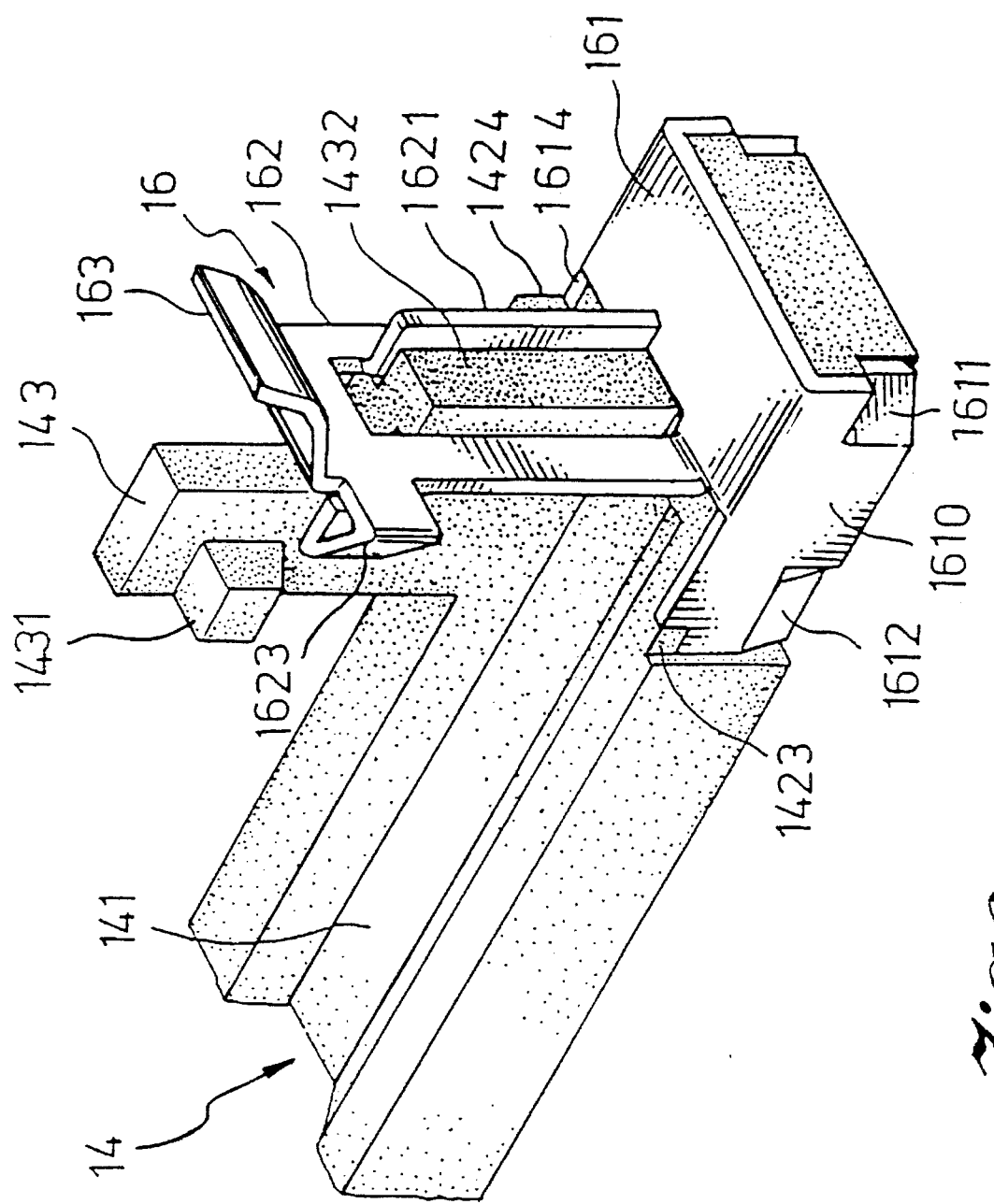
FIG. 3 is a partially enlarged fragmentary view of the first embodiment and contact terminals are omitted for simplification.

Referring now to FIGS. 1 through 3, an electrical connector 10 in accordance with the present invention mechanically and electrically connects a mother board (not shown) and a daughter board 12, which is inserted into the electrical connector 10. For example, the mother board is a memory control board while the daughter board is a single-in-line memory module (SIMM) on which a memory chip is mounted (not shown).

Referring to FIG. 2, the electrical connector 10 comprises an elongated connector housing 14 molded of an insulating resin material and two end portions 142. A groove 141 is provided longitudinally on the top surface of the housing 14 between the two end portions 142 for receiving the daughter board 12. A plurality of contact terminals 144 are arranged in the groove 141 of the housing 14 as shown in FIG. 1 to enable electrical contact between the mother board and the daughter board.

Referring to FIGS. 2 and 3, a pair of latch members 143 made of a resin material is integrally molded with the housing 14 and uprightly located adjacent to the end portions 142 of the housing 14. A rib or anti-rotational member 1432 is provided on the end portion 142. The side of the latch member 143, near to the groove 141 of the housing 14, is provided with a boss 1431. The other side of the latch member 143 is provided with a first tab 1424. When the bottom edge of the daughter board 12 is inserted into the groove 141 of the housing 14, the boss 1431 engages with the corresponding daughter board's opening 121 as shown in FIG. 1.

Still referring to FIGS. 2 and 3, a pair of metal fasteners or detachable latch members 16 each can be capable of clamping on the end portion 142 of the housing 14. Each metal fastener 16 comprises a fixing section 161 and a spring section 162 substantially extending therefrom. The fixing section 161 has two side plates 1610. Each side plate 1610 is provided with a pair of bendable mounting legs, hooks or anchoring members 1611 and 1612 separated by a space at the lower corners. The metal fastener 16 is fixed firmly by clamping the mounting legs 1611 and 1612 on the corresponding recess 1421 and slanting cut or catch 1422 provided at the bottom side of the end portion 142 of the housing 14. Further, a notch 1613 is formed at the corner of one of side plates 1610 of the fixing section 161 to engage a second tab 1423 provided at the side of the housing 14 opposite to the first tab 1424. The top edge of the other side plate 1610 resists against the bottom edge of the first tab 1424 of the latch member 143. Thus, the metal fastener 16 can resist the force exerted from varied directions and ensures its stability.

Still referring to FIGS. 2 and 3, the spring section 162 of the metal fastener 16 is flexible and a restriction leg or anti-overstress member 1621 and a slot or anti-rotational member 1622 are formed by punching the spring section 162. The restricting leg 1621 is substantially vertical to the surface of the spring section 162 and has a suitable clearance with the fixing section 161 such that it regulates any excessive flexing of the spring section 162 to avoid possible overstress. When the metal fastener 16 clamps on the housing 14, the rib 1432 of the latch member 143 exactly fits the slot 1622 so as to prevent the side shifting of the metal fastener 16.

A handle 163 is preferably provided on the upper end of the spring section 162 and extends such that it can be manually moved to flex the spring section 162 during attachment and detachment of the daughter board 12 to and from the housing 14. A lug 1623 is provided on the upper end of one edge of the spring section 162 such that it contacts the surface of the daughter board 12 to provide an auxiliary holding effect relative to the daughter board 12.

Figure 4:
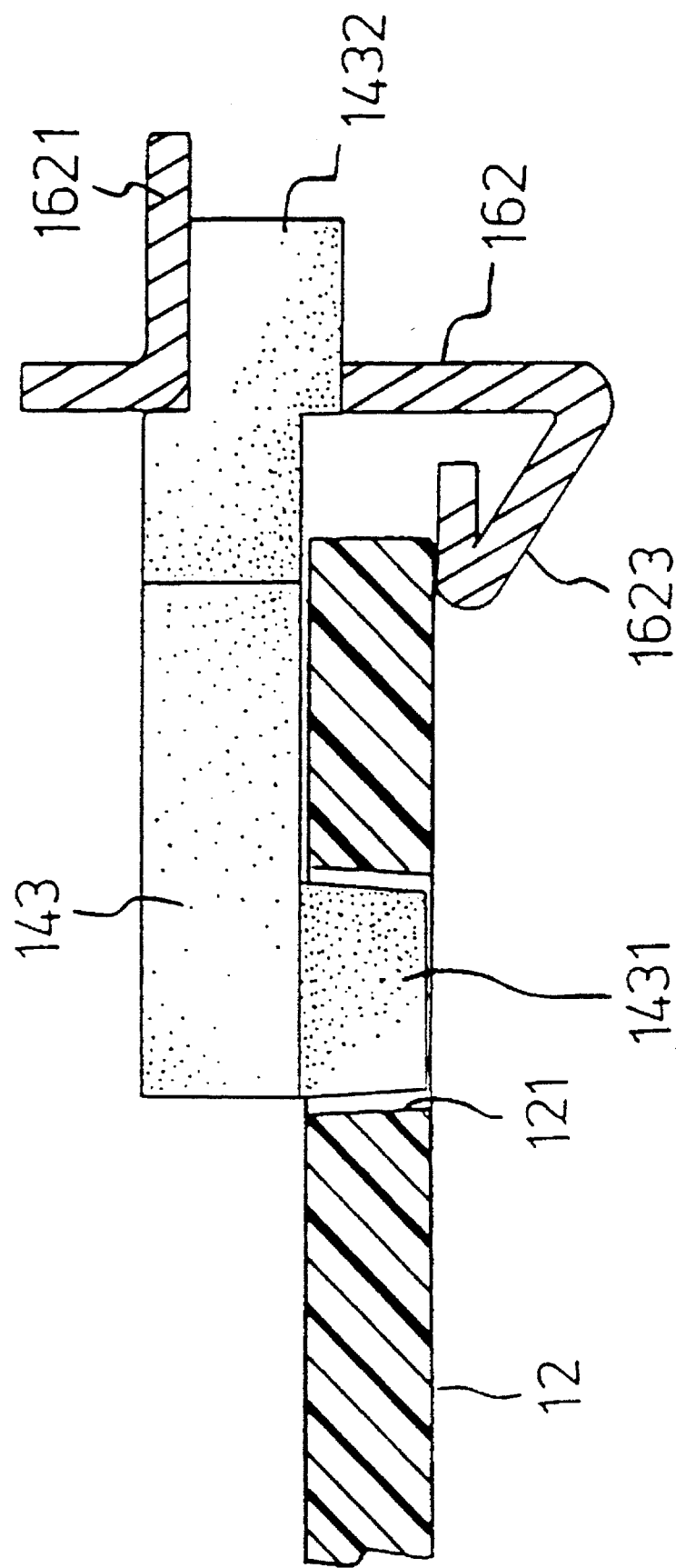
FIG. 4 is a sectional view taken substantially along the line 4—4 of FIG. 1.

With reference to FIG. 4, upon the attachment of the daughter board 12 to the electrical connector 14, the base end portion of the daughter board 12 is inserted into the groove 141 in an oblique direction to the mother board. Then the daughter board 12 is rotated toward the latch member 143. During the rotation process, the side edges of the daughter board 12 will slide on the slanting surface of the lug 1623 of the metal fastener 16 and the spring sections 162 are pushed out. When the base end of the daughter board 12 is vertically placed on the housing 14, the bosses 1431 of the latch members 143 are fitted in the associated openings 121 the daughter board 12. At the same time, the spring sections 162 elastically return to their initial position and hold the side edges of the daughter board 12 in a sandwiched relation. Upon the detachment of the daughter board 12 from the electrical connector 14, the spring sections 162 of the metal fastener 16 are expanded so as to move away from each other. This can be readily done by operating the handle 163 of the metal fastener 16. This operation unlatches the daughter board 12 from the paired metal fasteners 16. Then, the unlatched daughter board 12 can be removed from the electrical connector 14.

Figure 5:
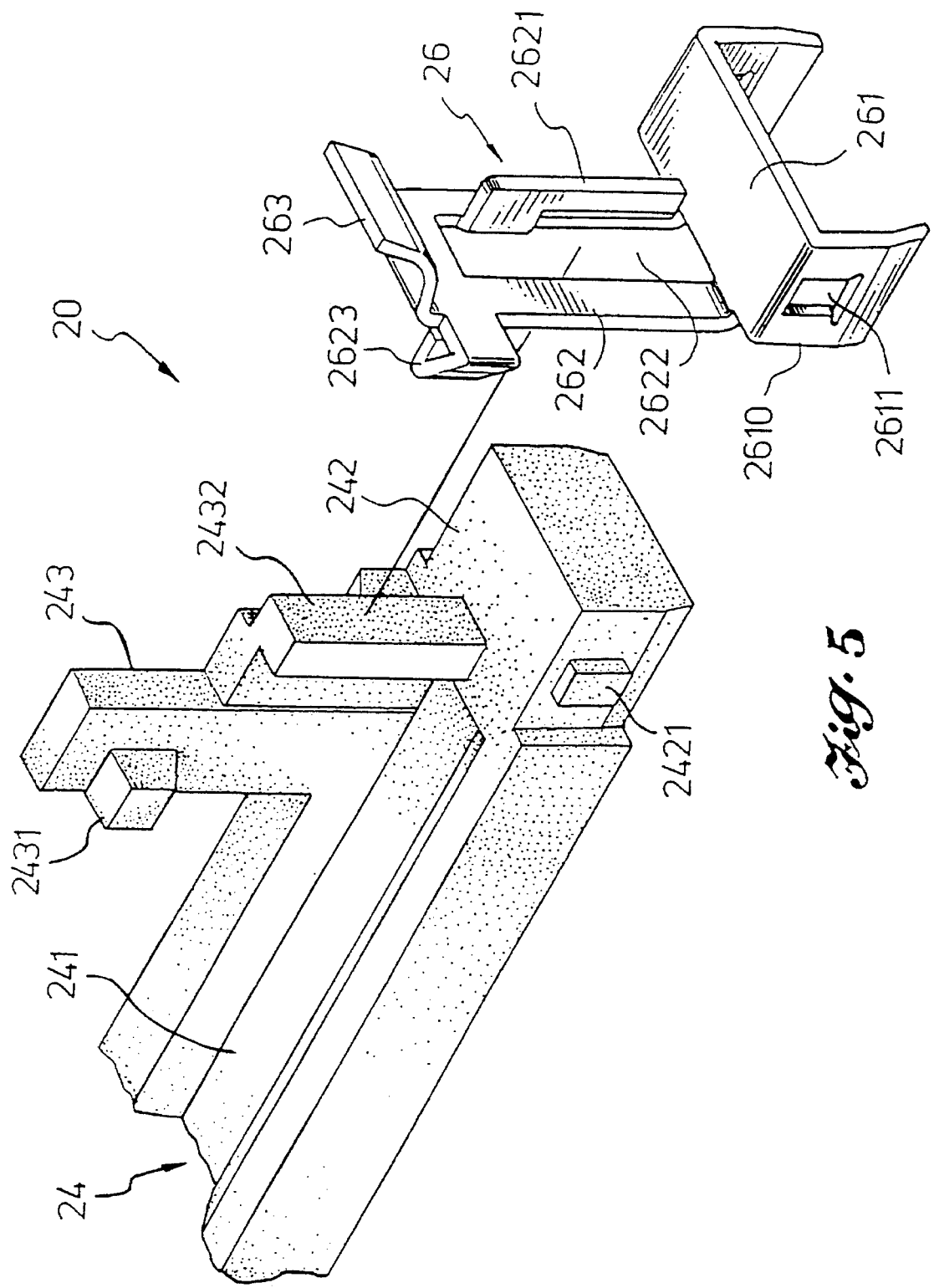
FIG. 5 is a partially enlarged fragmentary view of a second embodiment wherein contact terminals are omitted for simplification.
Figure 6:
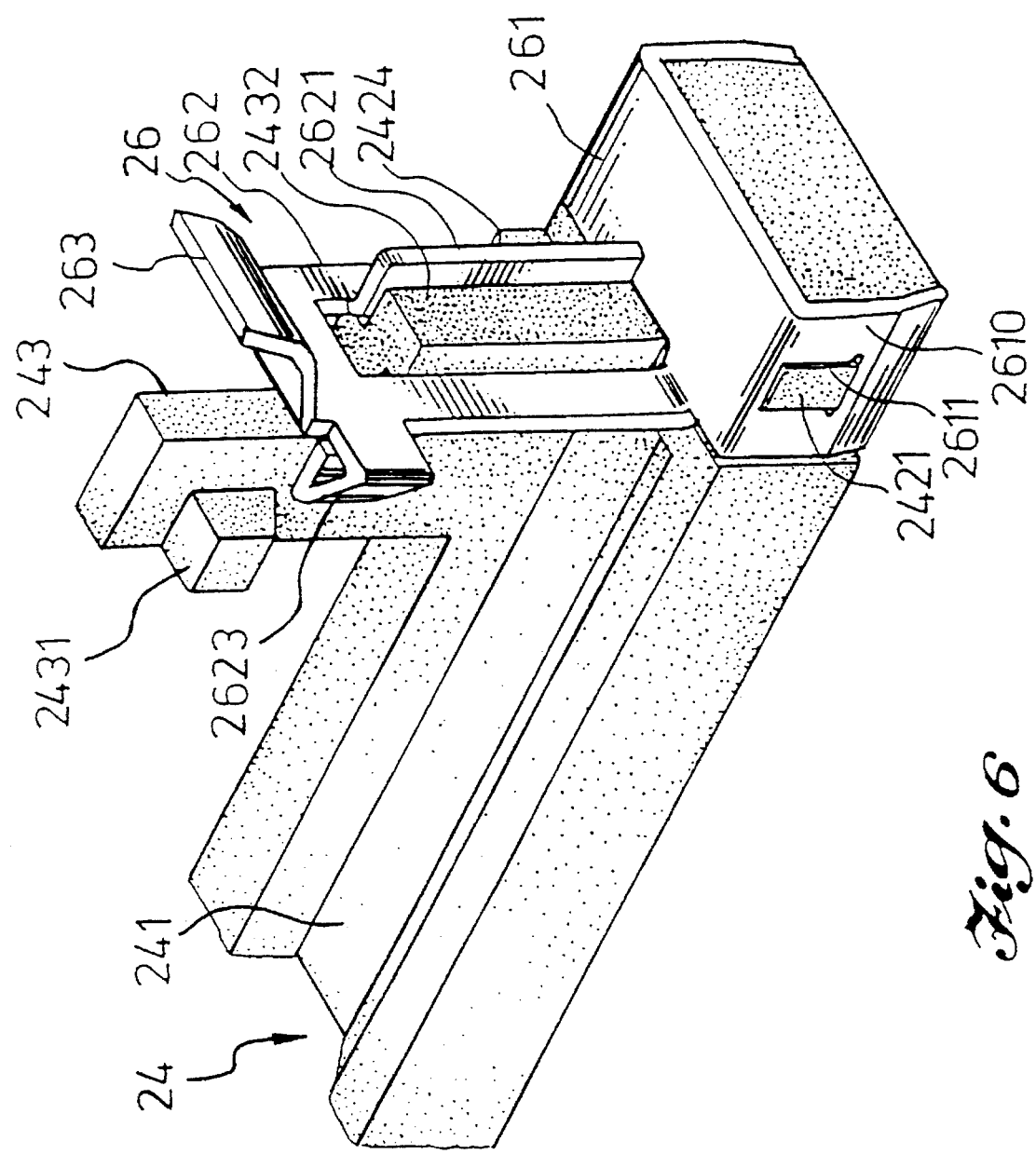
FIG. 6 is a partially enlarged fragmentary view of the second embodiment, and contact terminals are omitted for simplification.

FIGS. 5 and 6 show a second embodiment of an electrical connector 20. The electrical connector 20 comprises an elongated housing 24 molded of an insulating resin material and two end portions 242. A groove 241 is provided longitudinally on the top surface of the housing 24 between the two end portions 242 for receiving a daughter board. A plurality of contact terminals (not shown) are arranged in the groove 241 of the housing 24 to enable electrical contact between the mother board and the daughter board.

A pair of latch members 243 made of a resin material is integrally molded with the housing 24 and uprightly located adjacent to the end portions 242 of the housing 24. The end of the latch member 243, is provided with a rib 2432 near the end portion 242. The side of the latch member 243, which is located near the groove 241 of the housing 24 is provided with a boss 2431. When the bottom edge of the daughter board is inserted into the groove 241 of the housing 24, the boss 2431 engages the corresponding daughter board's opening (not shown).

A pair of metal fasteners 26 each can be capable of clamping onto the end portion 242 of the housing 24. Each metal fastener 26 comprises a fixing section 261 and a spring section 262 which substantially extends therefrom. The fixing section 261 has two side plates 2610. Each side plate 2610 has an opening 2611 in the center, thereby the metal fastener 26 is firmly clamping onto the side plates 2610 on the end portion 242 of the housing 24. It is to be noted that a corresponding projection 2421 provided at the side of the end portion 242 of the housing 24 fits the opening 2611. Thus, the metal fastener 26 can resist the force which is exerted from varied directions and ensures its stability.

The spring section 262 of the metal fastener 26 is flexible, and a restriction leg 2621 and a slot 2622 are formed by punching the spring section 262. The restricting leg 2621 is substantially vertical to the surface of the spring section 262 and has a suitable clearance with the fixing section 261 such that it regulates any excessive flexing of the spring section 262 to avoid possible overstress. When the metal fastener 26 clamps on the housing 24, the rib 2432 of the latch member 243 fits the slot 2622 to prevent the side shifting of the metal fastener 26.

A handle 263 is preferably provided on the upper end of the spring section 262, and it can be manually moved to flex the spring section 262 during attachment and detachment of the daughter board to and from the housing 24. A lug 2623 is provided on the upper end of one side edge of the spring section 262 such that it contacts the surface of the daughter board for further holding the daughter board.

The attachment and detachment operations of the daughter board to and from the electrical connector of the second embodiment are the same as that of the first embodiment. The detailed description is omitted hereinafter.

Of course it is understood that the above are merely two embodiments of the invention and that various changes and alterations can be made without departing from the spirit and broader aspects thereof as set forth in the appended claims.

What is claimed is:

1. A latch member in a board-to-board connector for latching a first circuit board at a predetermined angle with respect to a second circuit board, said latch member comprising:

a separate latch for resiliently latching the first circuit board, said separate latch having a punched slot and resiliently flexing away from the first circuit board during an installation and a removal of the first circuit board;

a rib located adjacent to the first circuit board and extending through said punched slot for guiding said separate latch and for preventing undesirable rotation of said separate latch during said installation and said removal; and an anti-overstress member located near said punched slot for preventing said separate latch from being overstressed during said installation and said removal.

2. A latch member according to claim 1, wherein said separate latch is a resilient metal latch.

3. A latch member according to claim 1, wherein said anti-overstress member is provided by a partially punched-out portion of said separate latch which corresponds to said punched slot, said anti-overstress member being integral to said separate latch.

4. A latch member according to claim 3, wherein said anti-overstress member has a horizontal portion and a vertical portion for making a reversed-L shaped configuration, said horizontal portion being attached to said separate latch.

5. A latch member in a board-to-board connector for latching a first circuit board at a predetermined angle with respect to a second circuit board, said latch member comprising:

a separate latch for resiliently latching the first circuit board, said separate latch having a punched slot and resiliently flexing away from the first circuit board during an installation and a removal of the first circuit board;

an anti-rotational member located adjacent to the first circuit board and extending through said punched slot for guiding said separate latch and for preventing undesirable rotation of said separate latch during said installation and said removal; and an anti-overstress member integral to said separate latch and provided by a partially punched-out portion which corresponds to said punched slot of said separate latch for preventing said separate latch from being overstressed during said installation and said removal.

* * * * *